United States Patent
Suwama et al.

(10) Patent No.: US 10,440,831 B2
(45) Date of Patent: Oct. 8, 2019

(54) CONDUCTIVE PATTERN FORMATION METHOD AND CONDUCTIVE PATTERN FORMATION DEVICE

(71) Applicant: Konica Minolta, Inc., Chiyoda-ku, Tokyo (JP)

(72) Inventors: Dai Suwama, Hachioji (JP); Sayaka Morita, Gamagori (JP); Keita Saito, Toyokawa (JP); Midori Shimomura, Hino (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 26 days.

(21) Appl. No.: 14/739,224

(22) Filed: Jun. 15, 2015

(65) Prior Publication Data
US 2015/0371740 A1    Dec. 24, 2015

(30) Foreign Application Priority Data

Jun. 24, 2014 (JP) ................. 2014-128722

(51) Int. Cl.
*H05K 3/12* (2006.01)

(52) U.S. Cl.
CPC ......... *H05K 3/1283* (2013.01); *H05K 3/1241* (2013.01); *H05K 2203/0126* (2013.01); *H05K 2203/0143* (2013.01); *H05K 2203/0278* (2013.01); *H05K 2203/1545* (2013.01)

(58) Field of Classification Search
USPC ............................. 427/97.4, 99.2
See application file for complete search history.

(56) References Cited

U.S. PATENT DOCUMENTS

| | | | | |
|---|---|---|---|---|
| 4,327,124 A * | 4/1982 | DesMarais, Jr. | ....... | H05K 1/095 228/180.1 |
| 5,496,433 A | 3/1996 | Miyashita et al. | | |
| 5,614,053 A | 3/1997 | Toudo et al. | | |
| 2005/0053772 A1* | 3/2005 | Aoki | ...... | B32B 27/06 428/209 |
| 2005/0214480 A1* | 9/2005 | Garbar | ...... | C09D 5/24 428/1.1 |
| 2009/0233237 A1 | 9/2009 | Yoshiki et al. | | |
| 2010/0203453 A1* | 8/2010 | Tokunaga | ...... | G03C 5/58 430/311 |

(Continued)

FOREIGN PATENT DOCUMENTS

| | | |
|---|---|---|
| JP | 55-083286 A | 6/1980 |
| JP | 05-269777 A | 10/1993 |
| JP | 07-156119 A | 6/1995 |

(Continued)

OTHER PUBLICATIONS

Machine translation of JP 2008-004375 (provided on IDS Jun. 15, 2015).*

(Continued)

*Primary Examiner* — Austin Murata
(74) *Attorney, Agent, or Firm* — Buchanan Ingersoll & Rooney PC

(57) ABSTRACT

A conductive pattern formation method includes: a step of patterning a base member with an ink in which conductive particulates are distributed to form a pattern; a step of making a conductive developer act on the pattern; and a pressurization step of pressurizing the pattern.

4 Claims, 5 Drawing Sheets

(56) References Cited

U.S. PATENT DOCUMENTS

2011/0300305 A1* 12/2011 Li .................. C23C 24/08
427/553
2014/0020938 A1* 1/2014 Mataki .............. H05K 3/1283
174/257

FOREIGN PATENT DOCUMENTS

| | | |
|---|---|---|
| JP | 08-018177 A | 1/1996 |
| JP | 2003-039417 A | 2/2003 |
| JP | 2005-177710 A | 7/2005 |
| JP | 2008-004375 A | 1/2008 |
| JP | 2010-087069 A | 4/2010 |
| JP | 2012-009546 A | 1/2012 |
| WO | 2007/148773 A1 | 12/2007 |
| WO | WO 2013/076999 * | 5/2013 |

OTHER PUBLICATIONS

Office Action (Notification of Reasons for Refusal) dated Apr. 21, 2016, by the Japanese Patent Office in corresponding Japanese Patent Application No. 2014-128722 and English translation of the Office Action. (9 pages).

Office Action (Decision of Final Rejection) dated Sep. 29, 2016, by the Japanese Patent Office in corresponding Japanese Patent Application No. 2014-128722 and English translation of the Office Action. (7 pages).

* cited by examiner

CONDUCTIVE PATTERN FORMATION METHOD AND CONDUCTIVE PATTERN FORMATION DEVICE

This application is based on Japanese Patent Application No. 2014-128722 filed on Jun. 24, 2014, the contents of which are hereby incorporated by reference.

BACKGROUND OF THE INVENTION

Field of the Invention

The present invention relates to a conductive pattern formation method and a conductive pattern formation device.

Description of the Related Art

Conventionally, as a method of forming a conductive pattern on a base member by application of printing technology, printed electronics is utilized. For a conductive pattern formation method using this method, in terms of flexibility of a base member which can be used and energy saving, a low-temperature process is required.

As a method that can satisfy such a requirement, in particular, attention is focused on a chemical burning method, which is a room-temperature process (see, for example, Japanese Unexamined Patent Application Publication No. 2008-4375). The chemical burning method is a method of making a conductive developer act on an ink (particle distribution liquid) in which conductive particulates are distributed to develop conductivity.

However, disadvantageously, in the chemical burning method described above, as compared with a thermal burning method utilizing thermal energy, the conductivity and the denseness of the developed conductive pattern are more likely to be lowered. Although patent documents 2 to 4 propose a method of pressurizing a pattern with a thermal burning method, such a method is not suggested for the chemical burning method, which is completely different from a thermal burning method.

In view of the foregoing problems, the present invention has an object to provide a conductive pattern formation method that can form a conductive pattern having high conductivity and denseness while adopting a chemical burning method and a conductive pattern formation device that uses the conductive pattern formation method to form a conductive pattern.

SUMMARY OF THE INVENTION

A conductive pattern formation method according to the present invention includes: a pattern formation step of patterning a base member with an ink in which conductive particulates are distributed to form a pattern; and an action step of making a conductive developer act on the pattern, where the conductive pattern formation method is a method of developing conductivity in the pattern by the action step to form a conductive pattern, and further includes a pressurization step of pressurizing the pattern.

With this method, it is possible to form a conductive pattern having high conductivity and denseness while adopting a chemical burning method. More specifically, in the method described above, the conductive developer may be made to act on the pattern before the start of the pressurization step.

More specifically, in the method described above, the pressurization step may be started before the resistance value of the pattern reaches 150% of a resistance value at the time of saturation by the action step or the pressurization step may be started after the conductivity is developed by the action step.

More specifically, in the method described above, in the pressurization step, the intensity of pressurization may be increased gradually or stepwise. More specifically, in the method described above, in the pressurization step, pressurization processing on the pattern may be performed a plurality of times, and as pressurization processing is performed later, the intensity of the pressurization processing may be increased. In the present specification, the "intensity of pressurization" and the "pressurizing force" mean a force that is applied per unit area.

A conductive pattern formation device according to the present invention includes: an ink application device that patterns a base member with an ink in which conductive particulates are distributed; an application device that applies, to the pattern, a conductive developer which develops conductivity; and a pressurization device that pressurizes the pattern.

DESCRIPTION OF PREFERRED EMBODIMENTS

An embodiment of the present invention will be described below with reference to drawings.

Figure 1:
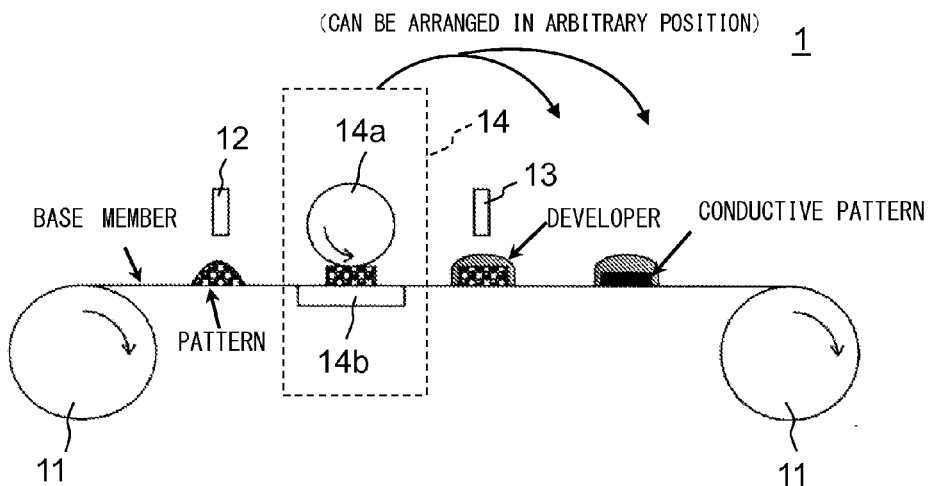
FIG. 1 A diagram schematically showing the configuration of a conductive pattern formation device according to the present embodiment.

FIG. 1 is a diagram schematically showing the configuration of a conductive pattern formation device 1 according to the present embodiment. The individual steps of conductive pattern formation are made to proceed from the left side (upstream side) to the right side (downstream side) of FIG. 1. As shown in FIG. 1, the conductive pattern formation device 1 includes a transport unit 11, an ink application unit 12, a developer application unit 13 and a pressurization unit 14.

The transport unit 11 is a unit that transports a base member for forming a conductive pattern on the surface from the upstream side to the downstream side, and for example, a device that utilizes the rotation of a roller to transport the base member can be adopted. The ink application unit 12 patterns the base member with an ink in which conductive particulates are distributed to form a pattern.

The developer application unit 13 is provided on the downstream side with respect to the ink application unit 12, and makes a conductive developer (hereinafter also referred to as the "developer" in short) act on the pattern on the base member. In this way, it is possible to form a conductive pattern with a chemical burning method. The developer is made to act on the pattern, thus conductivity is developed in the pattern and the resistance value thereof is gradually lowered, with the result that a conductive pattern having a desired resistance value is finally formed.

As the method of performing the patterning with the ink in which the conductive particulates are distributed to make the conductive developer act thereon and thereby developing conductivity, various types of methods including known methods can be adopted.

For example, a method (in which as the ink in which the conductive particulates are distributed, a metal colloid solution is used, and as the conductive developer, a compound having a halogen within its molecule by ion bonding is used) disclosed in Japanese Unexamined Patent Application Publication No. 2008-4375 may be adopted. For example, a method (in which as the ink in which the conductive particulates are distributed, a metal nanoparticle paste containing coated metal nanoparticles and a distribution solvent is used, and as the conductive developer, a polar solvent solution containing a solar solvent or a solubilizing assistant agent is used) disclosed in Japanese Unexamined Patent Application Publication No. 2008-72052 or the like may be adopted.

The base member for forming the conductive pattern may be a thick rigid base member or may be a thin film-shaped or sheet-shaped base member. In the case of the film-shaped or sheet-shaped base member, it is easy to cope with R2R (roll-to-roll).

In particular, in chemical burning, unlike thermal burning, it is not necessary to perform heating at the time of burning, and thus thermal expansion and thermal contraction are significant, with the result that a robber base member such as a silicone rubber, which is easy to deform by heating and a low-heat resistant resin base member such as PET can also be used. On the surface of the base member, processing for enhancing adherence to the conductive pattern may be performed. The conductive developer may be previously applied to the base member.

The pressurization unit 14 is a unit that pressurizes the pattern and applies a pressurizing force to the pattern from the upper side or the lower side. Examples of the pressurization unit 14 includes a press type, a roller type, a belt type and a type using a method of pushing a blade member thereto; as long as the pattern can be appropriately pressurized, the form thereof is not particularly limited.

In the present embodiment, as the pressurization unit 14, as shown in FIG. 1, the roller type is assumed to be adopted. More specifically, the pressurization unit 14 includes a metal roller 14*a* that presses the base member from the upper side and a pressurization support member 14*b* that supports the base member from the lower side.

When the base member is a flexible medium such as a polyimide sheet, a PET sheet, a PEN sheet, a ceramic green sheet precursor pair or paper, the pressurization surface of the pressurization unit 14 that makes contact with the pattern is preferably a rigid member. On the other hand, when the base member is a rigid medium such as metal, ceramics or glass, the pressurization surface is preferably rubber, resin or an elastic member.

On the pressurization surface of the pressurization unit 14 that makes contact with the pattern, surface processing for preventing the adherence of the pattern is preferably performed. Examples of the surface processing include processing that forms a fluoride film on the pressurization surface, and more specific examples thereof include processing that forms a coating film of fluoroalkylsilane (FAS) or polytetrafluoroethylene (PTFE).

When the pattern is pressurized by the pressurization unit 14, voids within the pattern are reduced, and thus it is possible to obtain the dense conductive pattern. In this way, the problems present in the conventional chemical burning method (problems in which the denseness of the formed conductive pattern is low and the conductivity and the mechanical strength are low) are significantly improved. The conductive pattern is made dense, and thus the conductivity, the mechanical strength for bending and the like are enhanced, with the result that the conductive pattern can be applied to a wide range of fields such as an application in which a conductive pattern having low resistance is required and patterning on a flexible base member.

The intensity of the pressurization on the pattern by the pressurization unit 14 may be set so as to be increased gradually or stepwise. Examples of the method of increasing the intensity of the pressurization gradually or stepwise include a method of changing a pressurizing force in one pressurization unit, a method of using a plurality of pressurization units of different pressurizing forces and a method of performing pressurization a plurality of times while changing a pressurizing force in one pressurization unit.

By pressuring, pressing and fixing the pattern in this way, it is possible to obtain an effect of reducing the disturbance of the pattern at the time of pressurization. This effect can be more satisfactorily obtained in particular when the pattern in liquid is pressurized and more specifically when the pattern is pressurized in a state where a larger amount of liquid than the volume of voids when the solid content of the pattern is closest packed is present around the solid content.

With the conductive pattern formation device 1 described above, in a predetermined series of steps, the conductive pattern is formed. The series of steps include (1) a pattern formation step of forming the pattern by patterning the base member with the ink in which the conductive particulates are distributed, (2) an action step of making the conductive developer act on the pattern and (3) a pressurization step of pressurizing the pattern.

It is not always necessary to perform the steps in this order. For example, the pattern formation step and the action step may be performed simultaneously, the pressurization step may be performed halfway through the action step or the pressurization step may be performed before the action step.

Figure 2:
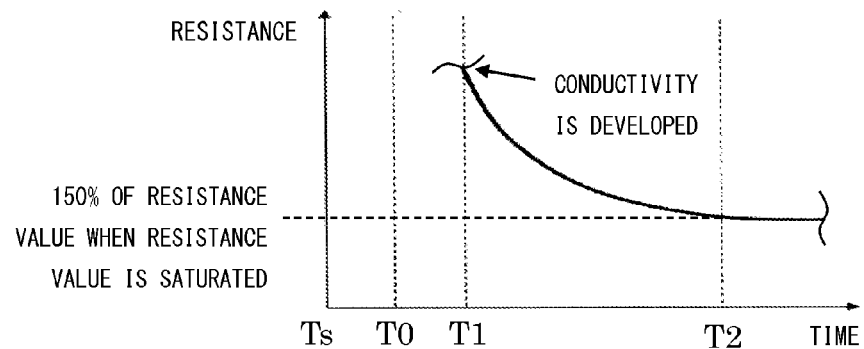
FIG. 2 A graph showing variations in the resistance value of a pattern.

FIG. 2 is a graph showing variations in the resistance value of the pattern in the series of steps. In this figure, the vertical axis represents the resistance value of the pattern, and the horizontal axis represents time. A timing Ts shown in FIG. 2 is a timing when the ink in which the conductive particulates are distributed is applied, and a timing T0 is a timing when the developer is applied to (is started to be made to act on) the pattern.

A timing T1 is a timing when conductivity is developed in the pattern by the application of the developer (conductivity is first developed from an insulated state), and a timing T2 is a timing when 150% of a resistance value at the time which the resistance value of the pattern is saturated (when it is completely lowered) is indicated. The timing T2 can also be regarded as a timing when variations in the resistance value of the pattern are almost completed. The timings (Ts, T0, T1 and T2) specified as described above will also be used in the following description.

Figure 3:
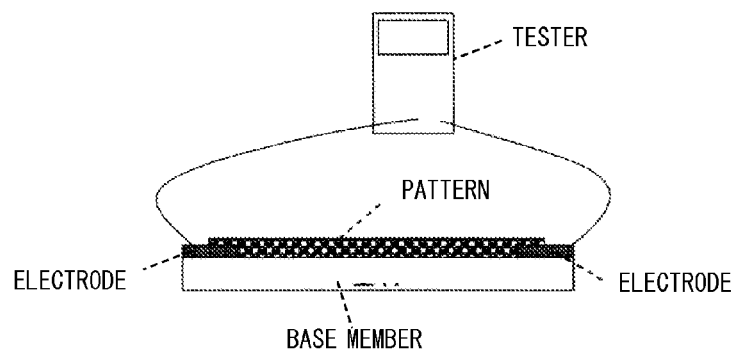
FIG. 3 An illustrative diagram on the measurement of the resistance value of the pattern.

The resistance value of the pattern can be measured, as shown in FIG. 3, with electrodes in contact with both ends of the pattern by connecting a tester to these electrodes. The timings T1 and T2 described above may be timings (for example, timings based on the time when the application of the developer is started) that are determined previously and experimentally by utilization of the measurement of the resistance value described above. Since the timings T1 and T2 have reproducibility, they can be determined previously and experimentally as described above.

The pressurization unit 14 can be arranged in an arbitrary position in the conductive pattern formation device 1, and the timing (start timing) when the pressurization step is started can be arbitrarily set. It has been found from the results of study by the applicant that the quality of the conductive pattern (mainly, the conductivity, the denseness and the degree of disturbance of the pattern) depends on the start timing of the pressurization step. Examples (examples 1 to 4) when the start timing of the pressurization step is allocated in various ways will be described below.

Example 1

Figure 4:
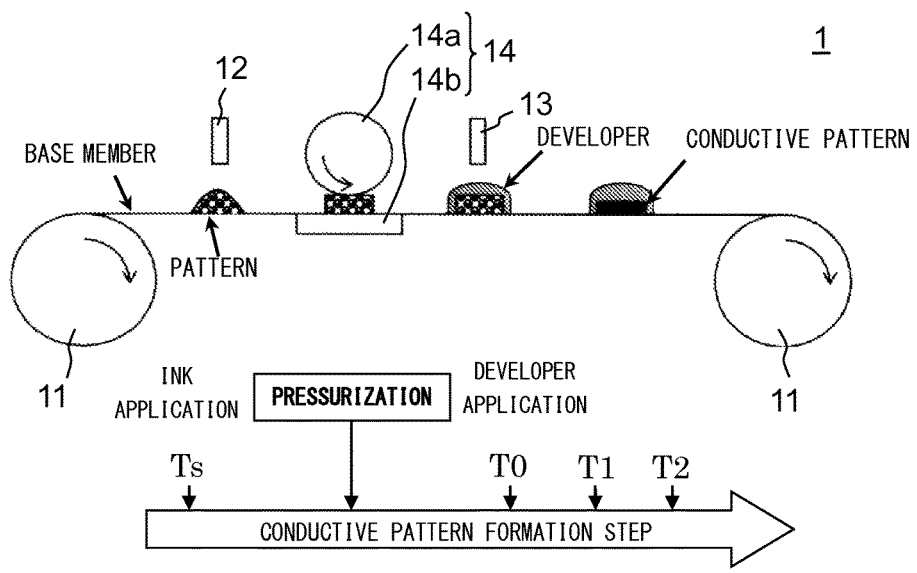
FIG. 4 An illustrative diagram of a conductive pattern formation step and the like in example 1.

FIG. 4 schematically shows the configuration of a conductive pattern formation device 1 and a conductive pattern formation step in example 1. In example 1, an organic solvent-based silver nanoink AG1TeH (the diameter of a silver ultra-particulate was about 10 nm) made by ULVAC material Inc. was used, and on a polyethylene terephthalate film (made by Teijin DuPont Films Ltd.) on which easy-adhesion processing was performed and whose thickness was 100 μm, a linear pattern whose length was 1 cm was drawn with a dispenser.

When the shape of the drawn linear pattern after drying was measured with Surfcom1400A type made by Tokyo Seimitsu Co., Ltd., the average thickness was 4 μm, and the width was 1 mm. Although the resistance value of the linear pattern was measured, as shown in FIG. 3, with the tester, an over-range was displayed, and conductivity was not observed.

More specifically, as the resistance value measurement method, the following method was adopted: on a base member on which electrodes were previously formed, the linear pattern was drawn so as to extend across the electrodes, and in an environment of a temperature of 23° C. and a humidity of 50% Rh, the resistance value between both ends of the linear pattern (between the electrodes) was measured with a PC500-type tester made by Sanwa Electric Instrument Co., Ltd. The timings T1 and T2 in examples below were also determined previously and experimentally with the same resistance value measurement method (the timing T1 was set at a timing when the resistance was first measured with the tester instead of the out-of-range state).

As the developer, a 5% sodium chloride aqueous solution was used. Specifically, the 5% sodium chloride aqueous solution was applied to the linear pattern described above, and thus conductivity was developed in the pattern.

The start timing of the pressurization step in example 1 was set to be after the timing Ts (the timing when the ink was applied) before the timing T0 (the timing when the developer was applied).

Example 2

Figure 5:
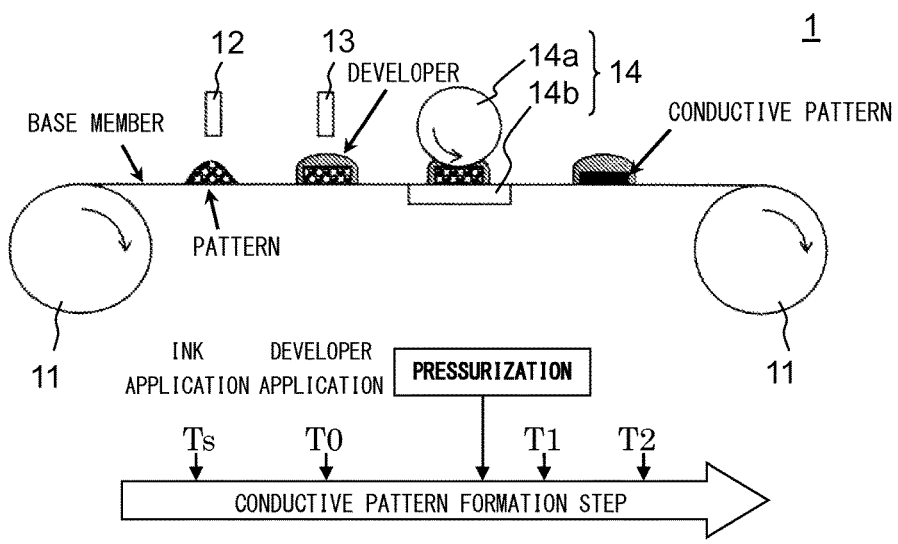
FIG. 5 An illustrative diagram of a conductive pattern formation step and the like in example 2.

FIG. 5 schematically shows the configuration of a conductive pattern formation device 1 and a conductive pattern formation step in example 2. As shown in the figure, the start timing of the pressurization step in example 2 was set to be after the timing T0 (the timing when the developer was applied) before the timing T1 (the timing when the conductivity was developed in the pattern). The other conditions were the same as in example 1.

Example 3

Figure 6:
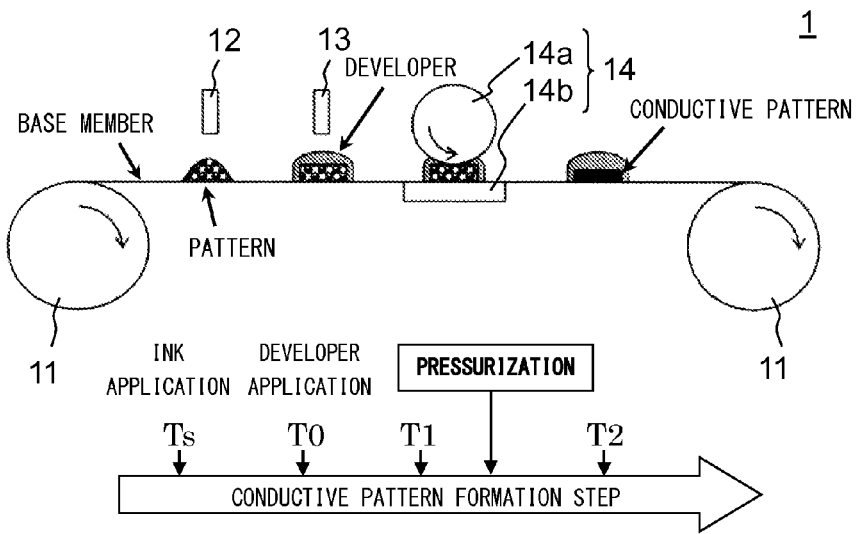
FIG. 6 An illustrative diagram of a conductive pattern formation step and the like in example 3.

FIG. 6 schematically shows the configuration of a conductive pattern formation device 1 and a conductive pattern formation step in example 3. As shown in the figure, the start timing of the pressurization step in example 3 was set to be after the timing T1 (the timing when the conductivity was developed in the pattern) before the timing T2 (the timing when 150% of the resistance value at the time which the resistance value of the pattern was saturated was indicated). The other conditions were the same as in example 1.

Example 4

Figure 7:
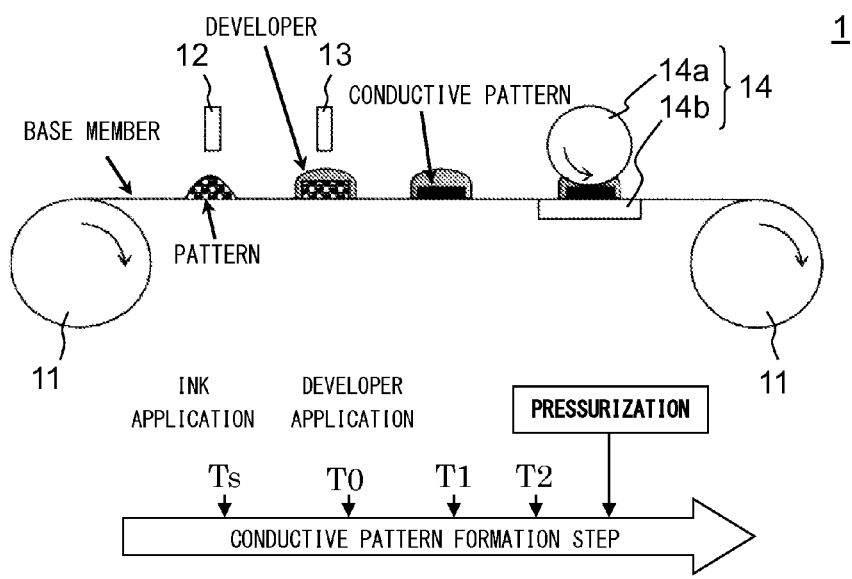
FIG. 7 An illustrative diagram of a conductive pattern formation step and the like in example 4.

FIG. 7 schematically shows the configuration of a conductive pattern formation device 1 and a conductive pattern formation step in example 4. As shown in the figure, the start timing of the pressurization step in example 4 was set to be after the timing T2 (the timing when 150% of the resistance value at the time which the resistance value of the pattern was saturated was indicated). The other conditions were the same as in example 1.

Comparative Example 1

Figure 8:
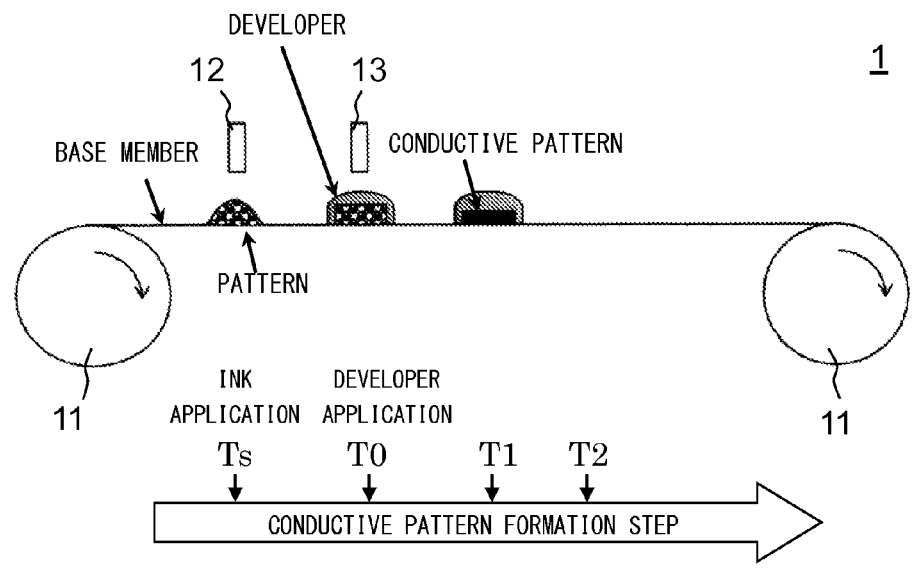
FIG. 8 An illustrative diagram of a conductive pattern formation step and the like in comparative example 1.

In order for the examples described above to be compared with a conventional case, the quality of a conductive pattern was checked on comparative example 1 (corresponding to a conventional example). FIG. 8 schematically shows the configuration of a conductive pattern formation device 1 and a conductive pattern formation step in comparative example 1. As shown in the figure, in comparative example 1, the pressurization step of pressurizing the pattern was not performed. The other conditions were the same as in example 1.

Results of Checking in the Examples and the Comparative Example

The results of the checking of the quality of the finally obtained conductive pattern for examples 1 to 4 and comparative example 1 described above are shown in table 1. With respect to the "conductivity·denseness", "×" represents a poor state, "Δ" represents a good state, "○" represents a very good state and "⊚" represents an excellent state. With respect to the "disturbance of the pattern", "Δ" indicates that the pattern was disturbed, "○" indicates that the pattern was slightly disturbed and "⊚" indicates that the pattern was little disturbed.

TABLE 1

| | Conductivity · denseness | Disturbance of pattern | Start timing of pressurization step | | | |
|---|---|---|---|---|---|---|
| | | | Ts-T0 | T0-T1 | T1-T2 | T2- |
| Example 1 | Δ | Δ | ✓ | | | |
| Example 2 | ⊚ | ○ | | ✓ | | |
| Example 3 | ⊚ | ⊚ | | | ✓ | |
| Example 4 | ○ | ⊚ | | | | ✓ |

TABLE 1-continued

| | Conductivity · denseness | Disturbance of pattern | Start timing of pressurization step | | | |
|---|---|---|---|---|---|---|
| | | | Ts-T0 | T0-T1 | T1-T2 | T2- |
| Comparative example 1 | X | ◎ | No pressurization step | | | |

As shown in table 1, it is found that in the present embodiment (examples 1 to 4) in which the pressurization step was provided, as compared with comparative example 1, the conductivity and the denseness were enhanced.

When as in examples 2 to 4, the pressurization step was started after the conductive developer was made to act on the pattern (in other words, when the conductive developer was made to act on the pattern before the start of the pressurization step), as compared with example 1 which was different from what has been described, the disturbance of the pattern was reduced. As described above, the conductive developer was made to act on the pattern before the start of the pressurization step, and thus it is possible to previously lower the function of distributing the conductive particulates within the pattern, and the unnecessary movement of the particles at the time of pressurization is reduced, with the result that it is possible to reduce the disturbance of the pattern.

In other words, in a method like a chemical burning method in which conductivity is developed in liquid, when the pattern is pressurized, the pattern is disadvantageously disturbed by the flow of the liquid at that time. More specifically, the pattern is pressurized in a state where a larger amount of liquid than the volume of voids when the solid content of the pattern is closest packed is present around the solid content, and thus the pattern is more likely to be disturbed by the flow of the liquid at that time of the pressurization of the pattern. The method of making the conductive developer act on the pattern before the start of the pressurization step contributes to the solution of such a problem, and the pattern is pressurized such that the disturbance of the pattern is minimized, with the result that it is possible to form a conductive pattern having high conductivity and denseness.

In terms of enhancement of the denseness of the pattern, as in examples 2 and 3, the pressurization step is more preferably started before the timing T2. The state after the timing T2 is a state where the burning is almost completed, that is, a state where the conductive particulates are sufficiently unified. Since in chemical burning, unlike thermal burning, there is a tendency that voids are produced within the conductive pattern to form the conductive pattern having low denseness, the effect of the denseness is relatively high even if the pressurization step is started after the timing T2. However, in order to more satisfactorily perform the denseness, it is preferable to start the pressurization step before the timing T2.

As compared with the state where the conductive particulates are sufficiently unified after the timing T2, in the state before the timing T2 (the state where the particles are not sufficiently unified, for example, a state where the conductive particulates of the primary particle diameter are adhered to each other), the pressurization is stated, and thus it is possible to easily move the particles, with the result that the effect of filling in the voids within the pattern by the moved particles (the effect of the denseness) is enhanced. When the pressurization of the pattern is started before the timing T2, even if the pressurization is continued even after the timing T2, it is possible to obtain the same effect.

In terms of preventing the disturbance of the pattern at the time of pressurization, as in examples 3 and 4, it is more preferable to start the pressurization step after the timing T1. Although as already described, immediately after the conductive developer is made to act on the pattern, it is possible to obtain the effect of reducing the disturbance of the pattern at the time of pressurization, it is more preferable to start the pressurization after the timing T1 (after a predetermined time has elapsed since the conductive developer started to act on the pattern, and more specifically, after the start of the adherence of the conductive particulates to each other).

In this case, the adherence of the conductive particulates to each other brings the particles into a fixed state, and thus the unnecessary movement of the particles at the time of pressurization is more satisfactorily reduced, with the result that the effect of reducing the disturbance of the pattern is more developed. It is more preferable to start, as in example 3, the pressurization step during a period from the timing T1 to the timing T2 both in terms of enhancement of the denseness of the pattern and in terms of preventing the disturbance of the pattern at the time of pressurization.

In order to check an effect obtained by setting the pressurization step such that pressurization processing on the pattern is performed a plurality of times and the like, the applicant formed a conductive pattern with a conductive pattern formation step in examples 5 to 7, which will be described later to check the quality thereof. These examples will be sequentially described below.

Example 5

Figure 9:
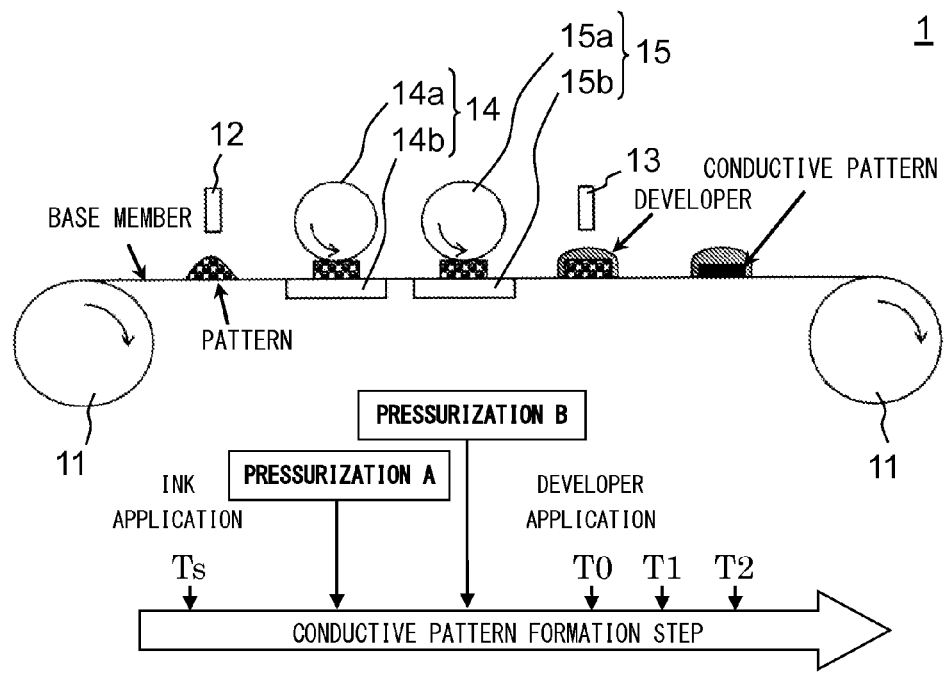
FIG. 9 An illustrative diagram of a conductive pattern formation step and the like in example 5.

FIG. 9 schematically shows the configuration of a conductive pattern formation device 1 and a conductive pattern formation step in example 5. As shown in the figure, in example 5, two pressurization units, that is, the pressurization unit 14 and a pressurization unit 15 are provided. The pressurization unit 15 has basically the same configuration as the pressurization unit 14, and includes a roller 15a that presses the base member from the upper side and a pressurization support member 15b that supports the base member from the lower side.

The pressurization unit 15 is assumed to be a unit that is arranged on the downstream side with respect to the pressurization unit 14. For convenience, as shown in FIG. 9, pressurization processing on the pattern by the pressurization unit 14 is referred to as "pressurization A", and pressurization processing on the pattern by the pressurization unit 15 is referred to as "pressurization B".

In Example 5, as the pressurization step, after the pressurization A is performed, the pressurization B is further performed. In order for the effect of reducing the disturbance of the pattern at the time of pressurization to be satisfactorily obtained, the pressurizing force of the pressurization B is set greater than that of the pressurization A. As shown in FIG. 9, the start timing of the pressurization A in example 5 is set to be after the timing Ts (the timing when the ink is applied) before the timing T0 (the timing when the developer is applied).

As shown in FIG. 9, the start timing of the pressurization B may be set to be before the timing T0 or may be set to be after the timing T0. The other conditions are the same as in example 1. When the quality of the conductive pattern obtained in the step of example 5 was checked, as compared with example 1, it was confirmed that the disturbance of the pattern was reduced.

Example 6

Figure 10:
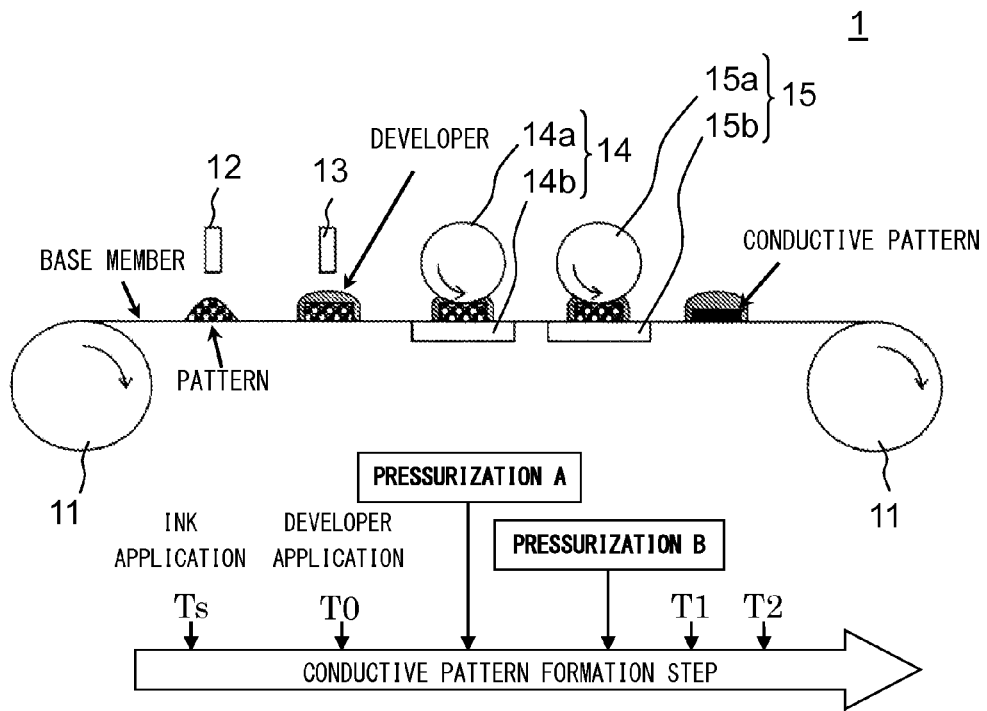
FIG. 10 An illustrative diagram of a conductive pattern formation step and the like in example 6.

FIG. 10 schematically shows the configuration of a conductive pattern formation device 1 and a conductive pattern formation step in example 6. As shown in the figure, in example 6, the start timing of the pressurization A is set to be after the timing T0 (the timing when the developer is applied) before the timing T1 (the timing when the conductivity is developed in the pattern).

As shown in FIG. 10, the start timing of the pressurization B may be set to be before the timing T1 or may be set to be after the timing T1. The other conditions are the same as in example 5. When the quality of the conductive pattern obtained in the step of example 6 was checked, as compared with example 2, it was confirmed that the disturbance of the pattern was reduced.

Example 7

Figure 11:
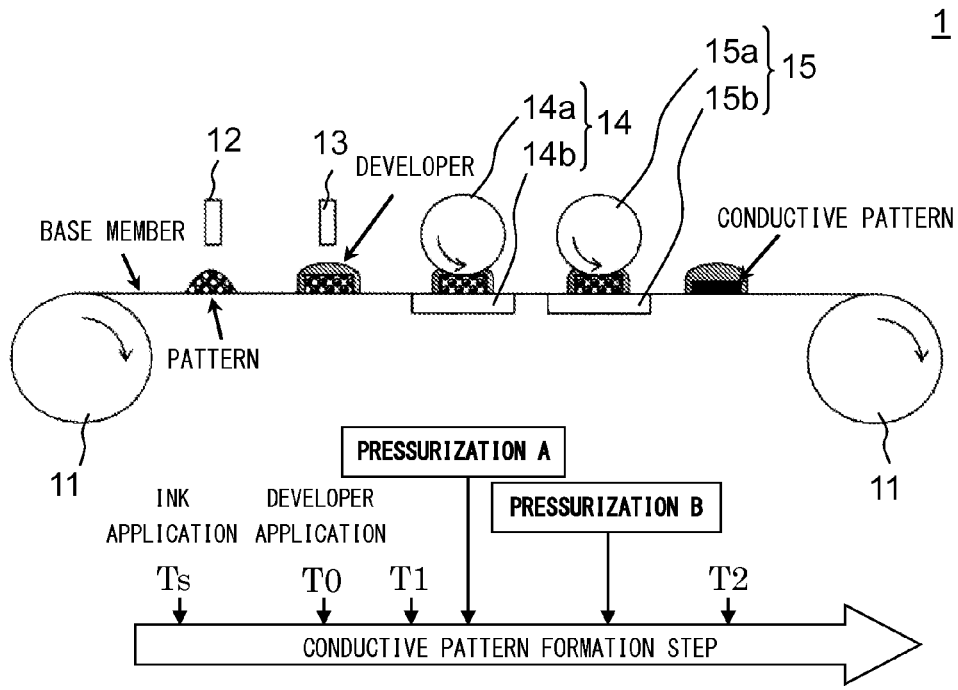
FIG. 11 An illustrative diagram of a conductive pattern formation step and the like in example 7.

FIG. 11 schematically shows the configuration of a conductive pattern formation device 1 and a conductive pattern formation step in example 7. As shown in the figure, in example 7, the start timing of the pressurization A is set to be after the timing T1 (the timing when the conductivity is developed in the pattern) before the timing T2 (the timing when 150% of the resistance value at the time which the resistance value of the pattern is saturated is indicated).

As shown in FIG. 11, the start timing of the pressurization B may be set to be before the timing T2 or may be set to be after the timing T2. The other conditions are the same as in example 5. When the quality of the conductive pattern obtained in the step of example 7 was checked, as compared with example 3, it was confirmed that the disturbance of the pattern was slightly more reduced.

As described above, the conductive pattern formation method according to the present embodiment includes the pattern formation step of forming the pattern by patterning the base member with the ink in which the conductive particulates are distributed and the action step of making the conductive developer act on the pattern, and develops the conductivity in the pattern by the action step to form the conductive pattern. The conductive pattern formation method according to the present embodiment further includes the pressurization step of pressurizing the pattern and thereby can form the conductive pattern having high conductivity and denseness while adopting a chemical burning method.

As the specific form of the conductive pattern formation device and the conductive pattern formation step (method) according to the present embodiment, various types of forms including examples 1 to 7 described above can be adopted. Among various types of forms, the optimum one can be preferably adopted according to the required product specifications and the like. The intensity of the pressurization of the pattern by the pressurization unit may be constant or may be increased gradually or stepwise such that the disturbance of the pattern is reduced.

The conductive pattern formed by the conductive pattern formation step according to the present embodiment can be utilized in various applications such as the electrode portions of electronic devices such as a printed wiring board, a membrane switch and a display, the antenna portion of a RFID and the wiring and the electrode portion of a wearable device and various sensors.

The details of the present invention are not limited at all to the embodiment described above. In the present invention, various variations are possible without departing from the intension thereof.

What is claimed is:

1. A conductive pattern formation method comprising:
    a pattern formation step of patterning a base member with an ink in which conductive particulates are distributed to form a pattern; and
    an action step of making a conductive developer chemically act on the pattern, wherein the action step develops conductivity in the pattern to form a conductive pattern, by chemical burning which does not include heating during burning; and
    a pressurization step of pressurizing the pattern, wherein the pressurization step is started before a resistance value of the pattern reaches, by the action step, 150% of a resistance value of the pattern at saturation, wherein the pressurization step is started while the conductivity is being developed by the action step.

2. The conductive pattern formation method according to claim 1,
    wherein the conductive developer is made to act on the pattern before start of the pressurization step.

3. The conductive pattern formation method according to claim 1,
    wherein during the pressurization step, an intensity of pressurization is increased.

4. The conductive pattern formation method according to claim 1,
    wherein in the pressurization step, pressurization processing on the pattern is performed a plurality of times, and as pressurization processing is performed later, the intensity of the pressurization processing is increased.

* * * * *